United States Patent [19]

Pirastehfar et al.

[11] Patent Number: 4,961,097
[45] Date of Patent: Oct. 2, 1990

[54] HIGH FREQUENCY PHOTO DETECTOR AND METHOD FOR THE MANUFACTURE THEREOF

[75] Inventors: Hassan Pirastehfar, Mesa; George C. Onodera; Waisiu Law, both of Phoenix; David M. Heminger, Mesa, all of Ariz.

[73] Assignee: Motorola Inc., Schaumburg, Ill.

[21] Appl. No.: 710,781

[22] Filed: Mar. 11, 1985

[51] Int. Cl.⁵ .............................................. H01L 27/14
[52] U.S. Cl. ....................................... 357/30; 357/32; 357/49; 357/52; 357/59; 357/68
[58] Field of Search ...................... 357/30, 32, 49, 52, 357/59, 68

[56] References Cited

U.S. PATENT DOCUMENTS 4,579,625 4/1986 Tabata et al. .................. 357/49

Primary Examiner—E. Wojciechowicz
Attorney, Agent, or Firm—Robert M. Handy

[57] ABSTRACT

An improved photo detector is provided by forming a tub of monocrystalline semiconductor material surrounded by a layer of monocrystalline material of opposite conductivity type. The improved structure is manufactured by means of a modified DIC process. The device may by made deep enough to absorb a large portion of the incident radiation near the PN junction without sacrificing a large number of photo-generated carriers to recombination.

5 Claims, 3 Drawing Sheets

HIGH FREQUENCY PHOTO DETECTOR AND METHOD FOR THE MANUFACTURE THEREOF

FIELD OF THE INVENTION

The present invention relates, in general, to optically sensitive semiconductor devices. More particularly, the invention relates to a highly efficient optically sensitive semiconductor PN junction structure and to a method for manufacturing such a structure.

BACKGROUND OF THE INVENTION

Optically sensitive semiconductor devices have been known for many years and are the basis for a wide range of standard products in the semiconductor industry. Any optically sensitive semiconductor device relies on the fact that electromagnetic energy above a threshhold frequency is capable of creating electron-hole pairs in semiconductor materials. If these carrier pairs are generated near an unbiased or reverse biased PN junction the mobile carriers will migrate across the junction to produce a useful current and/or voltage.

The design of any PN junction structure intended to be used for photo detection must take into consideration several fundamental limitations. It is, of course, desirable to increase the surface area of the structure which is exposed to electromagnetic radiation. However, it is also necessary to minimize the distance which mobile carriers must travel before crossing the junction. Increasing this distance proportionately increases the likelihood that a carrier will be lost through recombination, thus decreasing the efficiency of the device. Finally, the depth of the PN junction structure should be optimized so that a large portion of the incident energy is absorbed in the active region of the structure.

These design considerations conjoin to make it particularly difficult to fabricate an efficient photo detector of the type commonly used as a part of an integrated circuit. Such devices are commonly fabricated in a tub of monocrystalline semiconductor material which is isolated from nearby devices by a surrounding layer of oxide. The fabrication of a relatively deep junction with a short average path length for carriers has been accomplished in the prior art by diffusing a dopant from the surface of the tub into its interior. The high temperature, long period diffusion step required to realize this structure is generally undesirable in terms of its effects on other devices on the die and for other reasons.

SUMMARY OF THE INVENTION

Accordingly, it is an object of the present invention to provide an improved semiconductor photo detector.

It is a further object of the present invention to provide a high efficiency photo detector suitable for use as a part of an integrated circuit.

Yet a further object of the present invention is to provide an improved method of making semiconductor photo detectors.

These and other objects and advantages of the present invention are provided by a semiconductor photo detector comprising a body of monocrystalline semiconductor material having a first region comprising an interior of the body and a portion of a surface of the body being of a first conductivity type and a second region comprising the remainder of the body being of a second conductivity type. In a particular embodiment, the body of monocrystalline semiconductor material comprises a tub embedded in a larger body of polycrystalline semiconductor material and isolated therefrom by a layer of dielectric.

Efficaceous manufacture of such structures is provided by a process by which the body of monocrystalline semiconductor material is defined from a larger body of the material by etching grooves in the larger body to define the bounds of the smaller body. A dopant of opposite conductivity type to that of the starting material is applied over the exposed surface of the monocrystalline material and an overlying oxide layer is grown. Polycrystalline semiconductor material is deposited on the exposed face of the monocrystalline material and in the grooves. The monocrystalline material is then lapped back starting at the opposite face until portions of the polycrystalline are exposed. In this manner a tub of monocrystalline material of a first conductivity type surrounded by a layer of a second conductivity type has been defined in a body of polycrystalline semiconductor material. The dielectric layer isolates the tub from the polycrystalline material. Contacts to the regions of both conductivity types are then fabricated on the surface of the tub to yield a completed photo detector device.

These and other object and advantages of the present invention will be apparent to one skilled in the art from the detailed description below taken together with the drawings.

DETAILED DESCRIPTION OF THE INVENTION

Figure 1:
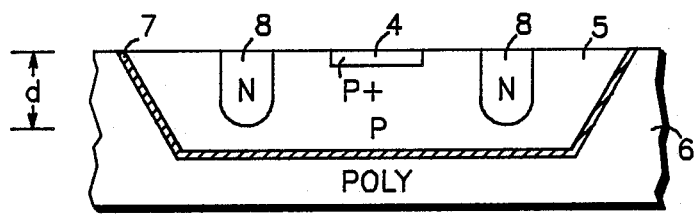
FIG. 1 is a cross sectional view of a dielectrically isolated photo detector according to the prior art.

FIG. 1 is a cross sectional view of a typical prior art photo detector manufactured using a dielectric isolation (DIC) process. A tub of monocrystalline semiconductor material 5, which is typically P-type silicon, is embedded in a body of polycrystalline semiconductor material 6, which is typically polysilicon. A dielectric layer 7, which is typically silicon dioxide, isolates tub 5 from polysilicon 6. In order to create a PN junction in tub 5, one or more diffusions 8 of an N-type dopant are formed. In addition, a P+ diffusion 4 is formed in tub 5 to provide an ohmic contact to the P-type material of tub 5.

The DIC process is particularly advantageous for manufacturing certain photo detectors because it provides relatively high voltage isolation between closely spaced devices and because it is readily applicable to the manufacture of devices in which photo detectors are integrated with other devices on a single die. However, the relatively high temperature and long period diffusion step necessary to drive diffusions 8 sufficiently deeply into tub 5 typically has negative effects on other devices being fabricated on the die. As is well known, the portion of the total incident radiation which is absorbed at any particular depth within a conductive or semiconductive body is an exponential function of depth. It turns out that in order to absorb approximately 90% of the incident radiation at a wave length of 870 nanometers within tub 5 it is necessary to make tub 5 approximately 40 microns deep. In order to decrease the average path which must be traveled by a mobile carrier before crossing the PN junction, it becomes necessary to drive diffusions 8 as deeply into the 40 micron deep tub 5 as possible. For example, this may require a diffusion at 1200° C. for six hours. As will be apparent to one skilled in the art, such diffusions are to be avoided if at all possible.

Referring now to FIGS. 2A–L a method of manufacturing improved photo detectors utilizing a DIC process and the photo detector so manufactured are described. The starting material in the process is a body 9 of monocrystalline semiconductor material. In a particular embodiment of the present invention body 9 is a wafer of P-type silicon with a resistivity of 3–6 ohm centimeters. Body 9 has a first major face 10 in to which a number of grooves 11 are etched. Grooves 11 are advantageously etched using an etchant, such as KOH, which preferentially etches certain crystallographic planes in the silicon over other planes. In the particular embodiment of the invention semiconductor body 9 has a <100> axis oriented perpendicular to first major surface 10 and grooves 11 etch substantially with the geometry shown. The depth of grooves 11 is determined by the width of the openings in the etch mask. The pattern of this etch mask is such that grooves 11 completely surround a region 16 of semiconductor body 9.

Figure 2A:
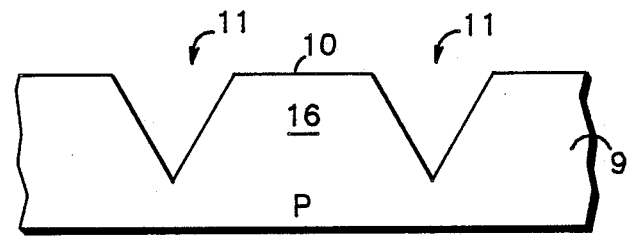
FIGS. 2A-L are cross sectional views illustrating a method for making dielectrically isolated photo detectors according to the principles of the present invention and illustrating the photo detector manufactured thereby.
Figure 2B:
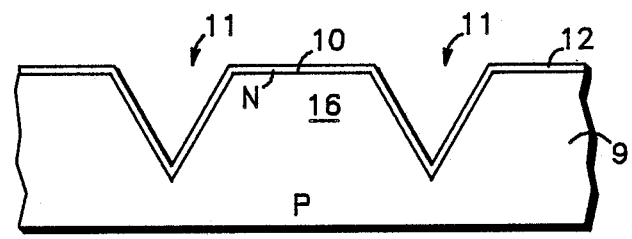

Once grooves 11 have been etched a layer 12 of monocrystalline semiconductor material of an opposite conductivity type to that of semiconductor body 9 is created overlying the entirety of first major surface 10, including grooves 11. The result is illustrated in FIG. 2B. Typically, this result is accomplished by applying a dopant material overlying first major surface 10 and diffusing the material into semiconductor body 9 by raising the wafer to a high temperature. In the particular embodiment of the present invention, it is desirable to use an N-type dopant to create layer 12 which has a low diffusivity in silicon. This is so that layer 12 will not be significantly altered by later high temperature processing. Antimony has been found to be an advantageous dopant for layer 12. According to this embodiment of the invention, layer 12 is doped to a sheet resistivity of approximately 32 ohms per square and a junction depth of approximately 2.7 microns.

Figure 2C:
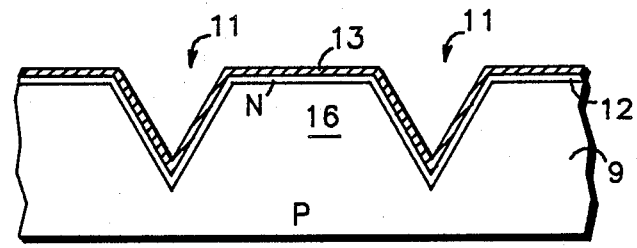

Subsequent to the creation of layer 12 an isolation oxide layer 13 is created overlying the entirety of layer 12. Typically, isolation oxide layer 13 is a thermally grown oxide having a thickness of 10,000 Angstroms. The result of this step is illustrated in FIG. 2C.

Figure 2D:
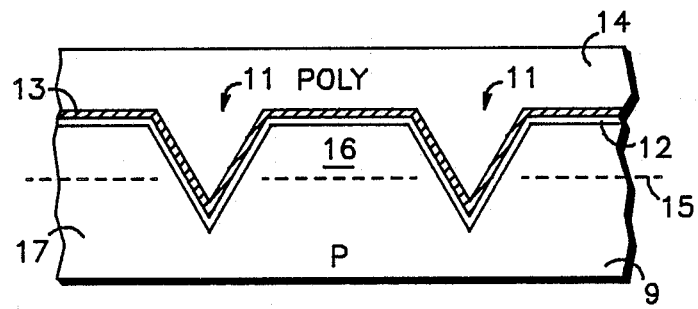

The next step in the Process involves the deposition of a relatively thick layer 14 of polycrystalline semiconductor material overlying isolation oxide layer 13. In the particular embodiment of the present invention layer 14 is polysilicon deposited by means of a chemical vapor deposition (CVD) process to a thickness of approximately 30 mils. The result of this step is illustrated in FIG. 2D.

Next, semiconductor body 9 is subjected to a lapping process which reduces the thickness of body 9 starting at a second major face 17 which is opposite to first major face 10. The lapping process is continued until second major face 17 is reduced approximately to the level of dotted line 15, or until a portion of polycrystalline semiconductor material layer 14 is exposed through second major face 17. The result of the lapping process is illustrated in FIG. 2E in which the entire wafer has been inverted, placing second major face 17 of semiconductor body 9 at the top of the figure.

Figure 2E:
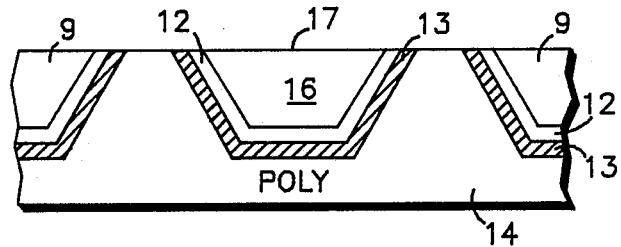
Figure 2F:
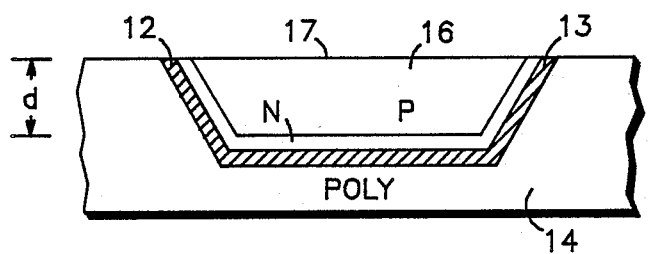
Figure 2G:
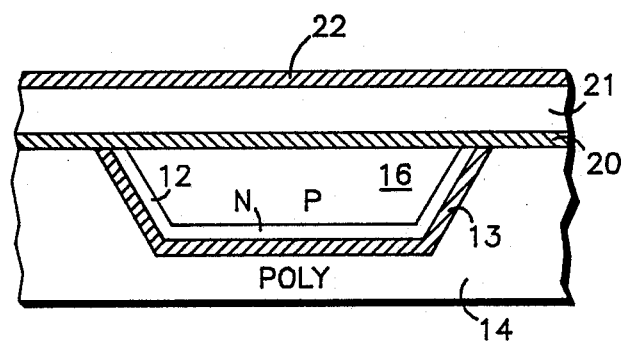

The structure of FIG. 2E is repeated in FIG. 2F in a slightly enlarged version to remove irrelevant detail and to render subsequent processing steps more easily visible. The structure of FIG. 2F is most easily described as a tub of monocrystalline semiconductor material 16 of a first conductivity type embedded in a body 14 of polycrystalline semiconductor material. Major face 17 of tub 16 is substantially coplanar with a face of body 14. A layer 12 of monocrystalline semiconductor material of a conductivity type opposite to that of tub 16 surrounds tub 16 and intersects major face 17. A layer of isolation oxide in turn, surrounds layer 12, and intersects major face 17. Tub 16 extends for a distance d below major surface 17. This depth of tub 16 is chosen so that a large portion of the incident radiation at a particular wave length will be absorbed within tub 16. In the particular embodiment of the invention it is desired to construct a photo detector optimized for a wave length of 870 nanometers. In this case tub 16 has a depth d of approximately 40 microns.

The processing steps used to achieve the structure of FIG. 2F are widely known in the semiconductor industry and are typically used to produce a tub of monocrystalline semiconductor material in which active devices may be fabricated which will be dielectrically isolated from nearby devices by the isolation oxide. Therefore, a number of variations on the process described with reference to FIGS. 2A–2F will be apparent to one skilled in the art. The major variation on the standard process introduced here is the creation of layer 12 having an opposite conductivity type to that of tub 16.

The following steps in the process involve the creation of masking layers preparatory to the definition of structures within tub 16. See FIG. 2G. First, a protective layer 20 of oxide is produced on major surface 17 of tub 16 and on exposed portions of polycrystalline material 14. In the particular embodiment, oxide layer 20 is produced by exposing the wafer to steam at 600° C. for approximately 30 minutes. Next, a masking layer 21 of silicon nitride is deposited overlying protective oxide 20. In the particular embodiment of the invention nitride masking layer 21 is approximately 1500 Angstroms thick and is deposited by an LPCVD process. Next, an extremely thin thermal oxide layer 22 is grown overlying nitride masking layer 21. In the particular embodiment of the invention thermal oxide layer 22 is produced by means of a process in which nitride layer 21 is exposed to an atmosphere of oxygen for approximately ten minutes followed by exposure for approximately three hours to an atmosphere of steam and HCl followed by a second ten minute exposure to an atmosphere of oxygen. The temperature at which this is carried out is 975° C. When this process is followed the resulting oxide layer 22 is so thin as to be nearly undetectable. However, it is entirely suitable for use as a mask to etch nitride layer 21.

Figure 2H:
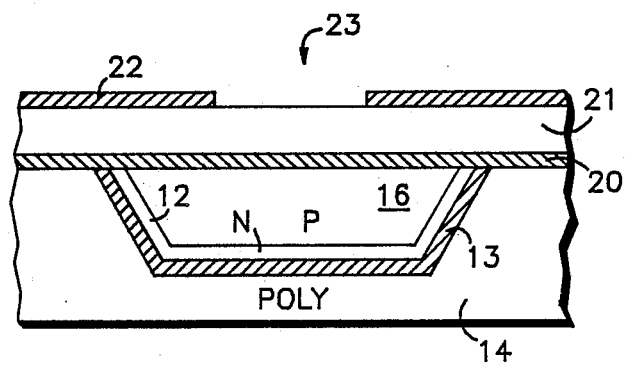

The following step in the process which is illustrated in FIG. 2H, is to remove a portion of thermal oxide layer 22 to expose a portion 23 of nitride 21. Exposed portion 23 of nitride layer 21 overlies the center of tub 16. The opening of thermal oxide layer 22 in this manner is achieved by conventional photoresist processing. It is found that the removal of the appropriate portion of thermal oxide layer 22 may be achieved by means of a 20 second etch in a room temperature solution of 6:1

NH4/HF in water. Once again it should be noted that the resulting pattern may not be clearly visible.

The next step in the process is to remove the exposed portion of nitride layer 21 by means of an etchant which does not attack thermal oxide layer 22. A solution of phosphoric acid at 150° C. is used for this purpose. It is important to maintain the freshness of the phosphoric acid solution to avoid the build up of reaction products which may attack oxide 22. It is found that this etch process produces an extremely accurately defined opening in nitride layer 21 without significantly attacking either thermal oxide layer 22 or protective oxide layer 20. Of course, other nitride etching processes, such as plasma etching, may be used in place of the phosphoric acid etch. Next, a standard pre-diffusion cleaning step is used to remove both thermal oxide layer 22 and the exposed portion of protective oxide layer 20. This process involves exposure to a solution of sulfuric acid and nitric acid for period of approximately 7 minutes at 100–110° C. followed by exposure to an 11:1 solution of HF in water for approximately 30 seconds.

Figure 2I:
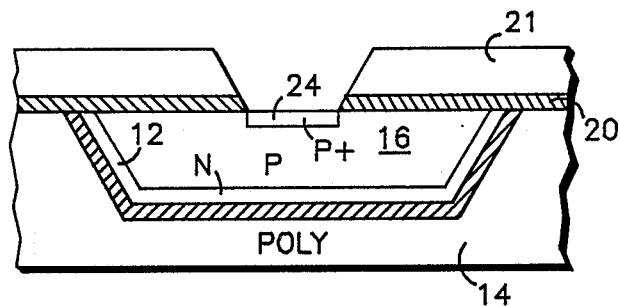
Figure 2J:
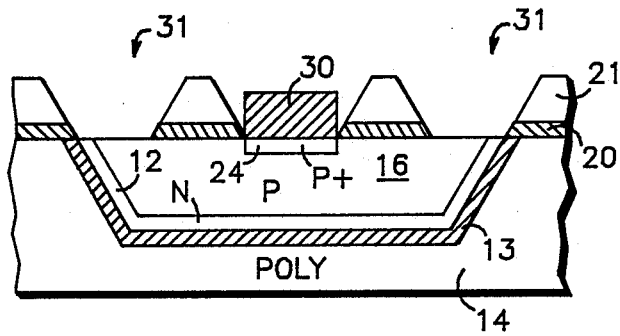

Once the above steps have been completed a P-type dopant is deposited over the surface of the wafer. This is followed by a diffusion step to drive the dopant into the surface of tub 16 where that surface is exposed. In the particular embodiment of the invention the chosen dopant is boron which is deposited in the form of $B_2O_3$. The diffusion step involves the heating of the wafer to 1,080° C. for approximately 15 minutes. The result is illustrated in FIG. 2I. A P+ region 24 has been defined in the upper surfaces of tub 16 approximately in the center thereof. The purpose of P+ region 24 is to provide an ohmic contact to the P-type material of tub 16. The diffusion step is followed by a standard process to remove the excess boron dopant. The wafer is exposed to an atmosphere of steam for approximately 30 minutes at a temperature of 600° C. Then the resulting oxide carrying the excess dopant is removed by a dip in an 11:1 solution HF in water for approximately 45 seconds.

Once P+ region 24 has been defined at the surface of tub 16 it is necessary to re-oxidize the surface of nitride layer 21 to prepare for the next masking operation. The wafer is exposed to an atmosphere of oxygen for approximately 10 minutes followed by an atmosphere of steam and HCl for approximately two hours followed by a second exposure to an atmosphere of oxygen for approximately 10 minutes. This is carried out at a temperature of 975° C. The result is once again an extremely thin thermal oxide layer overlying nitride layer 21. In addition, a relatively thick oxide layer 30 (See FIG. 2J) is grown overlying P+ region 24. As will be apparent to one skilled in the art, the thickness of oxide layer 30 overlying P+ region 24 will actually be significantly greater than the thickness of nitride layer 21. However, it is shown to be thinner for convenience.

The thermal oxide now overlying nitride layer 21 is next patterned using conventional photoresist processing and areas 31 are opened in nitride layer 21 and protective oxide layer 20 by means of the same steps as described above. It is important that the mask used to define areas 31 expose those portions of semiconductor layer 12 which intersect the surface of tub 16. To this end, the mask is typically made to expose portions of isolation oxide 13 or even beyond. This presents the problem that any process used to remove the desired portions of protective oxide layer 20 may also attack isolation oxide 13, thus producing an extremely irregular surface which will not be readily covered by metallization layers later in the process. However, the processing steps described above in which the nitride layer is removed in a hot phosphoric acid solution and both the thermal oxide layer and the protective oxide layer are removed using the standard pre-diffusion clean avoids this problem. This is because the pre-diffusion clean which removes protective oxide layer 20 is not strong enough or applied for a long enough period to significantly attack isolation oxide 13.

Once areas 31 have been opened to expose portions of the surface of tub 16 and the edges of layer 12, a dopant of the same conductivity type as that of layer 12 is deposited. In a particular embodiment of the present invention, the chosen dopant is phosphorous which is applied in the form of phosphine. The wafer temperature is brought to 800° C. over a 30 minute period. The wafer is then exposed to phosphine and the temperature is ramped up to 950° C. for a period of 3 minutes. The temperature is then brought down to a temperature of 800° C. The resulting N-type regions at the surface of tub 16 have a resistivity of 13–15 ohms per square. Next, an 11:1 solution of HF is water in used for a period of 20 seconds to remove the resulting oxide. Then a phosphorus redistribution process in which the wafer is exposed to an atmosphere of steam at 900° C. for one hour is applied. This alters the resistivity of the N-type regions at the surface of tub 16 to 16–19 ohms per square.

Figure 2K:
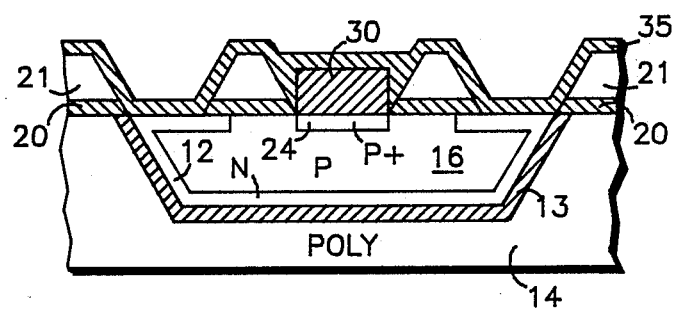
Figure 2L:
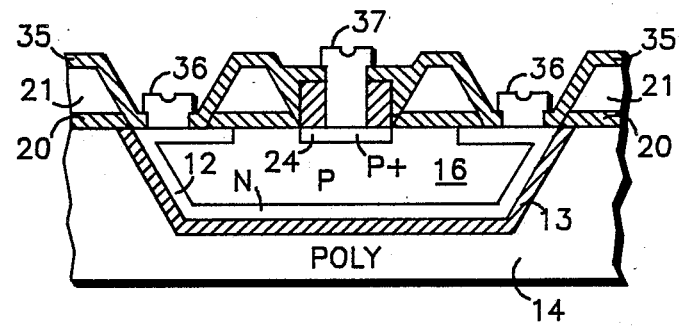

The next step in the process involves the deposition of an oxide layer 35 overlying the entire structure. In a particular embodiment of the invention, oxide layer 35 is a pyrolytic oxide layer between 4500 and 5500 Angstroms in thickness. After this step, the structure appears substantially as shown in FIG. 2K. As is apparent from FIG. 2K, N-type layer 12 has effectively been extended across the surface of tub 16 so that it nearly surrounds the entirety of tub 16. The only portions of tub 16 not surrounded by layer 12 are P+ region 24 and an area approximately 0.3 mil wide surrounding it. Subsequent processing steps involve the opening of contact vias in oxide layer 35 so that appropriate metallization patterns may be applied to the wafer and contacts made to P+ region 24 and to those portions of N-type layer 12 at the surface of tub 16. The resulting structure is illustrated in FIG. 2L.

Metal contact 36 extend through oxide 35 to contact N-type layer 12 near the edges of tub 16. In addition, a metal contact 37 extends through oxide layer 35 to make contact with P+ region 24 in the center of tub 16. It should be noted that while the illustrations herein have shown a device in which the width of tub 16 is only a few times larger than the depth of tub 16, this is not typically the case. In fact, in a particular embodiment of the present invention the finished photo detector is roughly a square approximately 10 mils on a side compared with a depth of 40 microns.

As will be apparent to those skilled in the art, the major portion of the volume of tub 16 is dedicated to the photo-generation of hole-electron pairs. In this particular embodiment of the invention, this hole-electron generation takes place in the P-type region which comprises the bulk of tub 16. The N-type layer 12 serves merely to create the PN junction necessary to capture the photo-generated minority charge carriers and to carry the resulting current to contacts 36. To decrease the resistance to current flow, N-type layer 12 will be doped more heavily than the p-type region of tub 16.

It will be apparent by now than an improved photo detector and an improved method for the manufacture thereof have been disclosed. The photo detector is manufactured according to a DIC process. However, the necessity for extremely deep dopant diffusions from the surface of the monocrystalline semiconductor tub has been avoided. Thus, a photodetector which represents an improved trade off between optimum depth and the average distance traveled by mobile carriers prior to crossing the PN junction is provided.

We claim:

1. A photo detector comprising:
    a body of polycrystalline semiconductor material having a major face and a surface defining a first tub therein;
    an isolation region being disposed about said surface of said body defining the first tub and having a surface defining a second tube;
    a first region of a monocrystalline semiconductor material having a first conductivity type, said first region being disposed about said surface of said isolation region defining the second tub and have a surface defining a third tub;
    a second region of said monocrystalline semiconductor material having a second conductivity type, said second region being disposed within the third tub defined by said first region and having a major face coincident with said major face of said body;
    a third region of said monocrystalline semiconductor material having said first conductivity type and being disposed in said second region such that a major face of said third region is coincident with said major face of said body and said third region is connected to said first region; and
    a forth region of said monocrystalline semiconductor material having said second conductivity type and being disposed in said second region such that a major face of said forth region is coincident with said major face of said body.

2. The photo detector of claim 1 wherein:
    said first, second, and third regions of said monocrystalline semiconductor material comprises silicon;
    said first conductivity type is a P-type silicon; and
    said second conductivity type is an N-type silicon.

3. The photo detector of claim 2 wherein said second region of said monocrystalline semiconductor material comprises antimony-doped silicon.

4. The photo detector of claim 1 further comprising:
    a first contact being coupled to said major face of said fourth region; and
    a second contact being coupled to said major face of said third region.

5. A photo detector comprising:
    a body of polycrystalline semiconductor material having a major face and a surface defining a first tub therein;
    an isolation region being disposed about said surface of said body defining the first tub and having a surface defining a second tube;
    a first collector region of a monocrystalline semiconductor material having a first conductivity type, said first collector region being disposed about said surface of said isolation region defining the second tub and having a surface defining a third tub;
    a generating region of said monocrystalline semiconductor material having a second conductivity type, said generating region being disposed within the third tub defined by said first collector region and having a major face coincident with said major face of said body;
    a second collector region of said monocrystalline semiconductor material having said first conductivity type and being disposed in said generating region such that a major face of said second collector region is coincident with said major face of said body and said second collector region is connected to said first collector region; and
    a contact region of said monocrystalline semiconductor material having said second conductivity type and being disposed in said generating region such that a major face of said contact region is coincident with said major face of said body.

* * * * *